(12) United States Patent
Nabet (10) Patent No.: US 7,705,415 B1
(45) Date of Patent: Apr. 27, 2010

(54) OPTICAL AND ELECTRONIC DEVICES BASED ON NANO-PLASMA

(75) Inventor: Bahram Nabet, Erdenheim, PA (US)

(73) Assignee: Drexel University, Philadelphia, PA (US)

(*) Notice: Subject to any disclaimer, the term of this patent is extended or adjusted under 35 U.S.C. 154(b) by 273 days.

(21) Appl. No.: 11/202,771

(22) Filed: Aug. 12, 2005

Related U.S. Application Data (60) Provisional application No. 60/601,678, filed on Aug. 12, 2004.

(51) Int. Cl.
  *H01L 27/088* (2006.01)
(52) U.S. Cl. .................. 257/449; 257/443; 257/461
(58) Field of Classification Search .......... 257/428, 257/431, 443, 449, 461, E31.065, E31.066
  See application file for complete search history.

(56) References Cited

U.S. PATENT DOCUMENTS

| 5,067,788 | A | 11/1991 | Jannson et al. |
|---|---|---|---|
| 5,385,865 | A | 1/1995 | Nieder et al. |
| 5,631,489 | A | 5/1997 | Roser |
| 6,031,243 | A | 2/2000 | Taylor |
| 6,178,275 | B1 | 1/2001 | Nerses et al. |
| 6,348,699 | B1 | 2/2002 | Zehe |
| 6,664,562 | B2 | 12/2003 | Weiss et al. |
| 6,987,484 | B2 * | 1/2006 | Von Klitzing et al. ....... 343/701 |
| 2003/0206708 | A1 | 11/2003 | Estes et al. |
| 2003/0219052 | A1 | 11/2003 | Goodhue et al. |
| 2004/0075464 | A1 | 4/2004 | Samuelson et al. |

FOREIGN PATENT DOCUMENTS

| WO | WO 98/49587 | 11/1998 |
|---|---|---|
| WO | WO 03/073563 | 9/2003 |
| WO | WO 03/092047 | 11/2003 |
| WO | WO 2004/004927 | 1/2004 |

OTHER PUBLICATIONS

Kaestner et al.,"Quasi-lateral 2DEG-2DHG junction in AlGaAs/GaAs", Microelectronics Journal 34 (2003) 423-425.*
Alexander Hellmans, French Team Demonstrates Terahertz Transistor, IEEE Spectrum, May 2004.

* cited by examiner

*Primary Examiner*—Michael B Shingleton
(74) *Attorney, Agent, or Firm*—Knoble, Yoshida & Dunleavy, LLC (57) ABSTRACT

A device for detecting electromagnetic radiation, charged particles or photons including a 2-dimensional electron gas (2DEG) and/or a 2-dimensional hole gas (2DHG). The device detects the collective response of the plasma to perturbations of the 2DEG and/or the 2DHG. The device is tunable by using Schottky contacts. The device can be used for high-speed photodetector devices, terahertz sensors, and charged particle sensors.

17 Claims, 9 Drawing Sheets

OPTICAL AND ELECTRONIC DEVICES BASED ON NANO-PLASMA

This application claims priority under 35 U.S.C. §119(e) based on U.S. Provisional Patent Application No. 60/601,678, filed Aug. 12, 2004, the entire disclosure of which is hereby incorporated by reference as if set forth fully herein.

This invention was made with government support under Grant NSF ECS0117073 awarded by the National Science Foundation (NSF). The Government has certain rights in invention.

BACKGROUND OF THE INVENTION

1. Field of the Invention

The invention relates to the field of detectors of electromagnetic radiation. In particular the invention relates to the use of a two-dimensional electron gas ("2DEG") and/or a two-dimensional hole gas ("2DHG") in the detection of electromagnetic radiation including terahertz frequency radiation, photodetection, and charged particle detection.

2. Description of the Related Technology

Confined electron behavior has ushered in a new era in electronics and photonics. Controlled variation of the energy level spacing and availability of electronic states using geometric or electrostatic confinement of carriers in quantum wells, quantum wires and quantum dots has led to important advances in transistors, diodes, LEDs and Lasers. The realization of systems in which carriers are effectively confined within planes, along one-dimension, in current rings, or through narrow constrictions or islands, has attracted enormous interest. Detailed investigations in mesoscopic systems have uncovered a range of exciting and unique electronic transport properties, including electron cavities, Kondo physics, the Aharonov-Bohm effect, and other effects, including quantum cascade LASERS, phonon confinement, optical phonon confinement, and exciton confinement.

Modulation doping of hetero-structures which allow electrons to be screened from their dopant ions and travel only subject to lattice and external forces has had a tremendous effect on transistor technology with high electron mobility transistors (HEMT) outperforming all others in terms of speed. Introduction of modulation doping in order to produce a dense arrangement of electrons, on the order of $10^{12}$ $cm^{-2}$ electrons in 1979 and, similarly, a dense arrangement for holes in 1984, has been the driving force behind such progress. In these devices, a heterojunction is made between lattice matched wide-gap and narrow-gap material. Doping of the wide-gap material introduces carriers that are transferred to the narrow-gap material and confined to it due to band-gap discontinuity. Two-dimensional clouds of both electrons, i.e. a 2DEG (2 dimensional electron gas) and holes, i.e. a 2DHG (2 dimensional hole gas) have been produced which have become conduction channels for both n-type and p-type HEMT devices.

In a HEMT device, gating of a channel of charge produces a transistor action and the speed of the device is limited by the transit time of the carriers from source to drain. The model used is that of a reservoir-channel-reservoir with the channel consisting of a 2DEG, or a 2DHG, with the reservoirs of electrons being ohmic metals of the source and the drain. Transit of electrons in this 2DEG is expedited since scattering by ionized dopants is removed. It is nevertheless conduction of the channel subject to an electric field that limits the speed.

Thus, there remains a need for a sensor for detecting electromagnetic radiation that can overcome the canonical limitations of drift or conductivity based devices, such as transistors, thereby achieving unprecedented speed and sensitivity. Such a development applies to a wide range of frequencies including frequencies used in photonics applications, to terahertz range frequencies, and to other detection modalities such as charged particle detection.

A new and important task for electromagnetic radiation sensors is the detection of terahertz (THz) radiation. Detection of the terahertz range of the electromagnetic spectrum, as well as other ranges of the electromagnetic spectrum, can play an important role in a variety of different technological and commercial fields. A unique feature of THz frequencies, as compared to shorter wavelengths, is that the ambient background thermal noise almost always dominates the naturally emitted narrowband signals. Therefore, either cryogenic cooling or long integration time radiometric techniques, or both, are typically required. Typically, THz components fall into two categories: sources and detectors. Other components such as waveguides, filters, antennas, amplifiers, and THz materials are also important to THz technology. Terahertz sources are difficult components to realize. The reasons for this include the high frequency roll-off of the electronic solid-state sources, difficulties that tubes face because of metallic losses and scaling problems, and low level photon energies (meV) of solid-state lasers operating at this range, where the energy is comparable to the relaxation energy of the crystal. As far as power level is concerned, frequency conversion techniques, either up from a millimeter wave, or down from the optical and infrared range, have so far been the most successful techniques.

One of the components that has received a lot of attention is the diode frequency multiplier. Varactor diode and Schottky diode multiplier circuits have been introduced multiplying MMW signals up to a few hundred GHz. Recently, a 200 to 2700 GHz multistage frequency multiplier was introduced using Schottky diodes on extremely thin GaAs substrate. A sub-millimeter-wave side band generator consisting of a whisker contacted Schottky varactor mounted in a waveguide is another recent example. This device is a sub-millimeter source with high efficiency and utilizes the pumped nonlinear reactance of the varactor. An output power of 55 µW at 1.6 THz with a conversion loss of 14 dB was reported. Microwave pump power of 20 dBm at 1.8 GHz and a $CO_2$-pumped far-IR laser with 3 mW power at 1.6 THz was used for this demonstration.

Some other methods of THz generation that have been reported by Kolodzey et al. are quantum well inter-sub-band transition in SiGe, boron doped resonant state transition in strained SiGe, and impurity transitions in doped Si. Recently, Shur and co-workers succeeded in obtaining voltage tunable emission of terahertz radiation from a gated 60 nm InGaAs high electron mobility transistor.

U.S. Pat. No. 5,631,489 to Roser discloses use of Schottky contacts for terahertz detectors used at room temperature. In Roser, an antenna is made from a whisker of metal (Au—Ni), and Schottky contacts are made from a platinum-gold alloy. A point contact Schottky diode is used as a heterodyne receiver.

Although the device of the instant invention is based on the formation of a plasma of charge using conventional MOD-FET technology, one of the distinctions from the devices discussed above is that in the proposed device the 2DEG is maintained in quasi-equilibrium and its perturbations are sensed using terahertz radiation. Using the instant invention's detection devices as high-speed, room temperature THz detectors can overcome one or more of the drawbacks found in the prior art. Furthermore, utilization of a tunable device using a 2DEG can also serve a role in providing fast and reliable detectors of other wavelengths of electromagnetic radiation including optical detectors used in fiber optic communication systems, as well as other modalities such as charged particle detection.

Therefore, there exists a need for detection devices using a 2DEG to improve sensing of terahertz radiation and other electro-magnetic radiation in order to provide viable, highly sensitive, detectors.

SUMMARY OF THE INVENTION

Accordingly, various embodiments of the invention provide methods and apparatus for using a 2DEG or 2DHG to detect terahertz radiation, for photodetection, or for charged particle detection.

In a first aspect of the invention, a detector for detecting electromagnetic radiation is provided having a first layer forming a substrate; a two-dimensional plasma formed on the first layer; a second layer formed on the two-dimensional plasma; and Schottky contacts placed on the second layer.

In a second aspect of the invention a method for detecting electromagnetic radiation is disclosed having the steps of forming a two-dimensional plasma and detecting plasmons caused by perturbations of the two-dimensional plasma by electromagnetic radiation.

In a third aspect of the invention a tunable device for detecting electromagnetic radiation is disclosed having means for forming a two-dimensional electron gas, wherein the two-dimensional electron gas has a reservoir of carriers; means for coupling electromagnetic radiation to the reservoir of carriers; and means for detecting the electromagnetic radiation.

These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 1b shows a close up view of the AlGaAs material shown in FIG. 1a.

FIG. 5b shows a vertical profile of the electron energy of the device shown in FIG. 5a.

FIG. 7b shows the top view of the structure of FIG. 7a.

DETAILED DESCRIPTION OF THE PREFERRED EMBODIMENT(S)

The invention utilizes a novel mechanism of detection in order to make detectors that can be used as high-speed photodetector devices, terahertz sensors, and charged particle (such as electron beam) sensors. The collective response to the perturbation of a cloud of charged particles, in the form of a two-dimensional electron gas (2DEG) or a two-dimensional hole gas (2DHG), is used in order to detect the stimulating radiation with high sensitivity and high speed. This mechanism can be used in the detection of optical signals, terahertz signals and other electromagnetic radiations. Application areas can be in optical communications, biomedical in-vivo and in-vitro imaging, near infrared detection, satellite communications, charged particle detection for use in medical electron beam tomography, in scanning electron microscopy, and devices used for national security.

The detector can be used as a photodetector device. Application areas of photodetectors are broad, ranging from optical communications to biomedical imaging. A photodetector device is well-suited for testing the very high speed of response that can be observed using the present invention. This ability assists in demonstrating the concept of collection in a plasma of charge.

The photodetector device is also useful for making optical detectors. The photodetector can be used as an optical detector that removes the long tail of response that almost always limits a standard detector's speed of response. Optical detectors of such high speed can be used in optical communications, imaging, biological applications, spectroscopy, and microscopy.

The detection device can additionally be used as a terahertz (THz) detector. Terahertz detectors are also useful in a variety of fields. Terahertz detectors are broadly applicable to sub-millimeter-wave energy that cover the wavelength range between 1000-100 μm (300 GHz-3 THz), corresponding to an approximate photon energy of between 1.2-12.4 meV and an equivalent blackbody temperature of 14-140 K.

Terahertz detectors can be used for T-Ray imaging. T-ray imaging technology combines imaging, real time acquisition of terahertz waveforms and advanced signal processing to obtain far-infrared images of objects and materials. T-Rays are able to be used for research applications, such as plasma fusion diagnostics, electron bunch diagnostics, mapping of current distribution in electronic devices, and THz spintronics; commercial applications such as, skin imaging for cancer detection, mail inspection, luggage inspection, and gas spectroscopy; and defense applications such as, homeland security, chemical and biological agent detection, explosives detection, see-through-the-wall technology, and imaging in space using satellites. Terahertz technology is also useful for molecular spectroscopy of the earth, planets, and space. Many key species either have thermal emission line peaks or their first rotational or vibrational line emissions in the submillimeter range, especially between 300-2500 GHz, and are best observed from platforms above the Earth's atmosphere.

Additionally, the detector can be used as a charged particle detector, such as an electron detector. Electron detectors are used in the mapping of current in semiconductor devices and in medical applications such as electron beam tomography (EBT). They are key components in instruments such as scanning electron microscope (SEM), and scanning tunneling microscope (STM.)

The detector uses the collective response of charge, confined to a nano-scale to make sensors of optical, terahertz and charged particles with unprecedented sensitivity and speed. The cloud of charge forms a plasma. This plasma can be either a 2DEG or a 2DHG. For ease of discussion throughout this specification, 2DEG is used in the description. However, it is intended that a 2DHG can be used instead of a 2DEG in each of the scenarios described below. In a photodetector application, this plasma of charge essentially collects the electrons and holes that are generated by the incident optical signal. The 2DEG is used for electrons and the 2DHG for holes. In charged particle detection application either 2DHG or 2DEG can be used. In the THz application 2DEG is preferable in III-V systems such as GaAs, GaN, or InP. However, for group IV heterojunctions such as Si/SiGe, 2DHG may be obtained more easily. The invention is, however, independent of the material system used.

The dense cloud of charge in the form of a plasma is confined in a semiconductor in the nano-scale range and is constructed and maintained in quasi equilibrium, such that it collectively responds to stimuli. A number of devices based on this plasma of charge can overcome the canonical limitations of drift and conductivity based devices, such as transistors. This can achieve unprecedented speed and sensitivity and is used to create detectors of Terahertz radiation based on the natural frequency of the plasma. This has the useful characteristic that the detector depends upon the charge density; therefore control of the charge density can tune the frequency of detection. The collective response of charge can also be used in optical devices that can respond in the sub-picosecond range and are no longer limited by carrier transit time. The collective response of charge can also be used for charged particle detection.

The detectors of the instant invention take advantage of a relatively free cloud of charge produced by modulation doping, however they have an additional distinction in that they are contacted by blocking Schottky contacts that maintain a 2DEG as a reservoir of carriers. Schottky contacts are used to form the boundaries for the reservoir of carriers. A Schottky contact is a metal-semiconductor contact that forms a barrier to current flow from metal to semiconductor; it is a blocking contact. Application of voltage to this contact can make it act like a diode that conducts under forward bias but not under reverse bias, so it is also called a Schottky diode. A reverse biased Schottky contact is used as a gate for field effect transistors such as MESFETs (Metal Semiconductor Field Effect Transistors) and MODFETs (Modulation Doping Field Effect Transistors), also known as HEMTs (High Electron Mobility Transistors), controlling the current flow between the source and the drain. These contacts reflect the electron wave incident on them, in a similar manner to a mirror that reflects photons. In fact spatial electron density variation patterns similar to standing waves are produced in the system. A resonance condition between these standing waves, which are the plasmons, and external radiation are detected in the device. Importantly, this resonance frequency also depends on the total number of carriers, hence the total carrier density is controlled by gating the device in the instant invention using Schottky gates. This feature is also important since, by controlling the total carrier density, the resonance frequency can be tuned.

The 2DEG remains a cloud in quasi-equilibrium, with its natural oscillation in charge density. The 2DEG can be considered a plasma of charge. Perturbation of this plasma by external stimuli results in a collective interaction, the rate of which is based on the fundamental carrier-collective carrier, or plasmon scattering rate.

Plasmons are oscillations in charge density relative to the background charges of screened impurities. A plasmon is the particle resulting from the quantization of plasma oscillations, which are density waves of the charge carriers in a conducting medium such as a metal, semiconductor, or plasma. The plasmon scattering rate in the instant invention is on the order of picoseconds. Indeed, thermalization time, that is the time at which a cloud of carriers reaches a new thermal equilibrium distribution, is reported to be as short as 10 femtoseconds for electrons and 60 femtoseconds for holes. Thus, so far as such a cloud of charge can be maintained in quasi-equilibrium, it reacts to an external stimulus with sub-picosecond time constants. This can be used in a mechanism for collecting optically generated carriers much faster than allowed by their transit time.

Figure 1A:
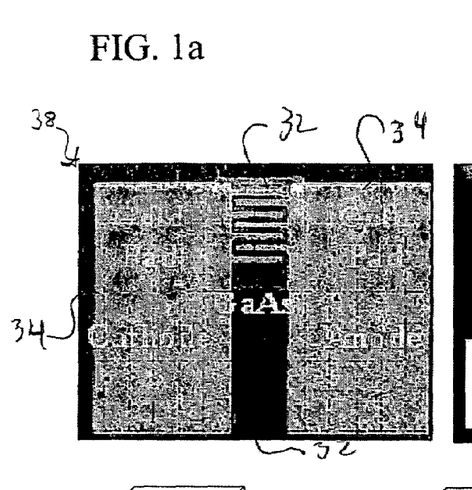
FIG. 1a shows a top down view of a two-dimensional electron gas device.
Figure 1B:
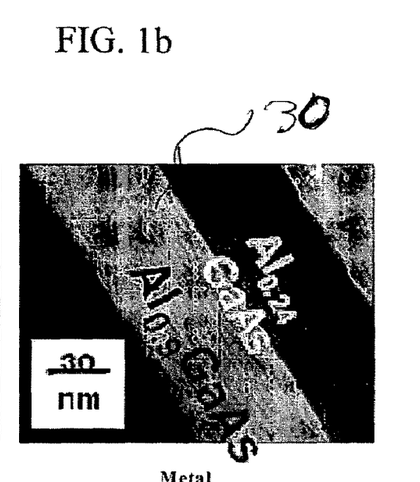
Figure 1C:
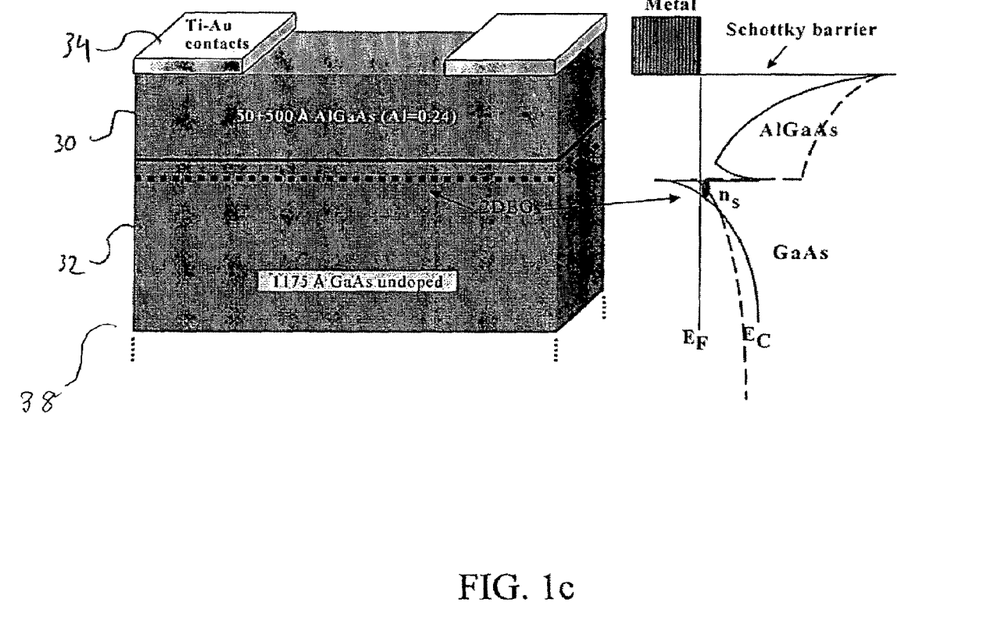
FIG. 1c shows a schematic diagram of a heterojunction metal-semiconductor-metal photo-detector with Schottky contacts.

An embodiment of a detector is shown in FIGS. 1a-1c. Detector 38 is used for high sensitivity, high-speed detection of optical stimulus, however it can also be used for the detection of other types of electromagnetic radiation and charged particles. FIG. 1a shows a top down view of a two-dimensional device showing Schottky contacts 34 forming a cathode and an anode, and the undoped GaAs layer 32. FIG. 1b shows a close up view of AlGaAs material 30. FIG. 1c shows a schematic diagram of a heterojunction metal-semiconductor-metal photodetector with Schottky contacts 34 placed on top of a wide-gap material layer 30 which makes a heterojunction with a narrow-gap material 32. The energy band diagram is shown at the right FIG. 1C for when the widegap material is doped (solid line) or undoped (dashed line). Similar to a high electron mobility transistor (HEMT), n-type doping of an AlGaAs/GaAs heterostructure produces a 2DEG at the heterointerface on the narrow gap side. This 2DEG is confined in a triangular potential well that is formed on one side due to conduction band discontinuity and the other side due to band banding. An internal electric field is formed due to charge transfer across the heterointerface that confines the resultant transferred charge. While in a HEMT device, the 2DEG is contacted by the ohmic source and drain metal through a deep annealing process, in the device shown in FIGS. 1a-1c, two Schottky contacts 34, constructed of titanium and gold, are made on top of the AlGaAs layer 30. These are a variation of Metal-Semiconductor-Metal (MSM) Photodetector devices where current transport under darkness is primarily determined by thermionic emission of carriers across the metal widegap semiconductor. The existence of the 2DEG is shown to affect this transport of charge partially because of the reduced dimensional nature of the density of states in the semiconductor and partially due to the coulombic force that this cloud of charge exerts on the emitted carriers from metal. The effect of this force appears as an increase in barrier height, and hence decreases the thermionic emission current.

Figure 2A:
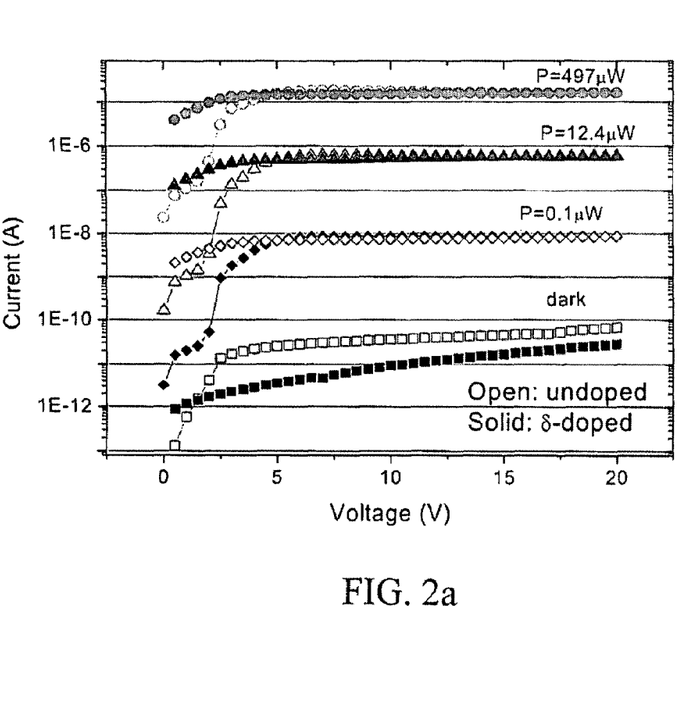
FIG. 2a is a graph depicting a doped device and an undoped device showing current-voltage data under different illumination intensities.
Figure 2B:
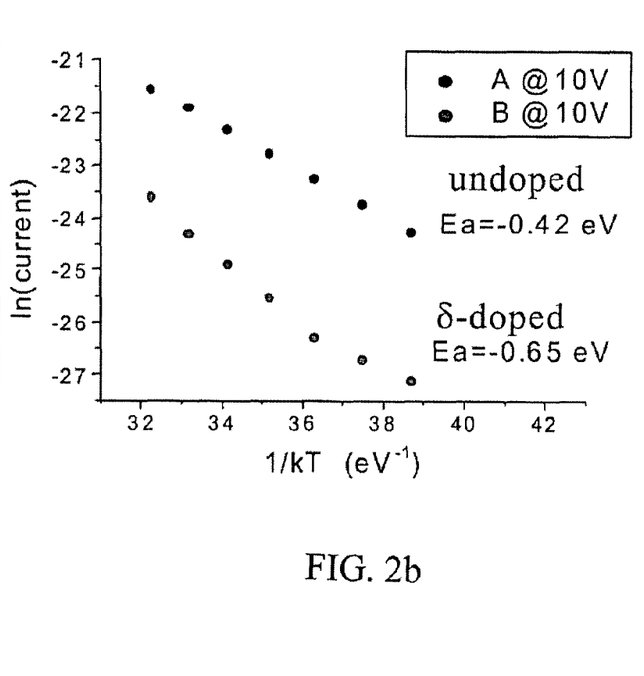
FIG. 2b is a graph depicting dark current at different temperatures showing different activation energies (barrier heights) for both a doped and an undoped device.

In order to show the effect of the 2DEG on current transport, FIGS. 2a and 2b compare two detectors 38 that are identical except for the (delta) doping of the widegap material. Current-voltage data under dark and under various illumination intensities show that the doped device has lower dark current but similar light response. An Arrhenius plot comparing dark current conduction at various temperatures is shown in FIG. 2b. The plot highlights the large increase of about 0.23 eV in activation energy (a measure of barrier height) at 10V for the delta-doped device. It is important to observe the small amount of dark current that flows, scaling to a few femtoamps per $\mu m^2$, even in the presence of a large number of mobile electrons, of the order of $10^{12}$ $cm^{-2}$.

Figure 3A:
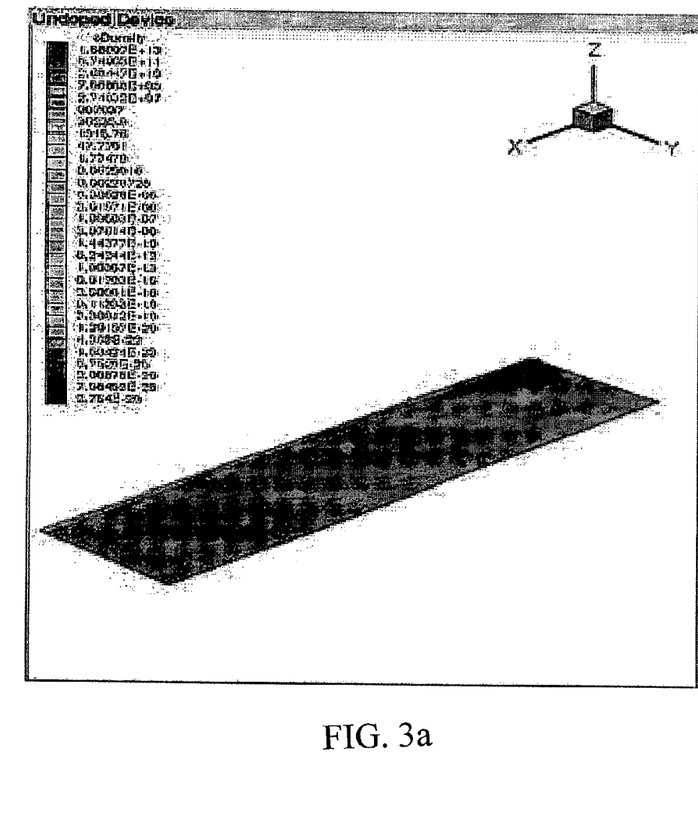
FIG. 3a shows a diagram of the energy levels in an undoped device.
Figure 3B:
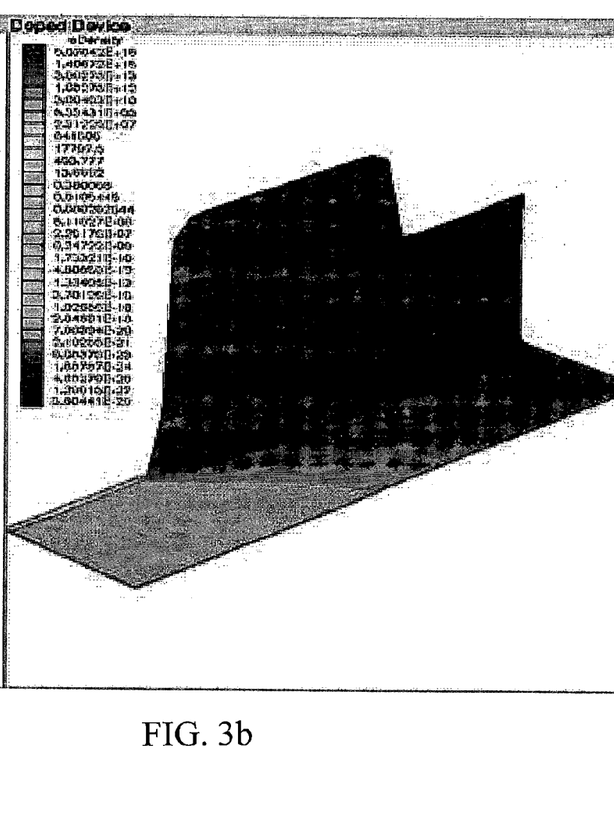
FIG. 3b shows a diagram of the dense cloud of charge produced in an AlGaAs/GaAs modulation doped heterojunction.

FIGS. 3a and 3b show a simulation of the carrier concentration in two detectors 38. FIG. 3a shows the carrier concentration in a detector 38 without delta doping, and FIG. 3b shows the concentration in a detector 38 with delta doping. A large reservoir of mobile electron cloud exists in the doped device, and even under 20 V of bias, very little current flows. This is dramatically different from a HEMT, where, in the scenario described above, the cloud would be transported between the source and the drain. Experiments have shown that in identical structures where the contact was changed to an ohmic contact, dark current in the milliamp range was conducted. That is, change of contacts from Schottky to Ohmic causes a large increase of current, by over 7 orders of magnitude, and results in a classic picture of two reservoirs of carriers (contacts) connected by a drift channel. In detector 38, a reservoir of carriers is under quasi-equilibrium, indicated by the small amount of current flow, mainly due to hot thermal electrons. It should be noted that current in the absence of stimulus is noise. This dense cloud of charge remains under quasi-equilibrium even with an applied bias. In the photodetector designs proposed here, this cloud acts as the collector of optically generated carriers. The response of this cloud to external stimuli such as Terahertz radiation or charged particles is used for high sensitivity detection of such stimuli.

In a reduced dimensional regime, perturbation of charge carrier density results in an electric field that opposes such fluctuations resulting in oscillation at a plasma frequency that is quantized, due to charge confinement, leading to the term 'plasmon.' A plasmon thus indicates the collective behavior of the plasma. Plasmons in 2DEG were first seen for electrons in liquid helium in 1976 and then in various inversion layers of silicon in 1977, and GaAs in 1979. The detectors can harness the rich dynamics of such a plasma because of the improvement in growth technology and fabrication techniques that allows the cloud to be formed free of competing scattering effects, particularly surface roughness scattering.

Figure 4:
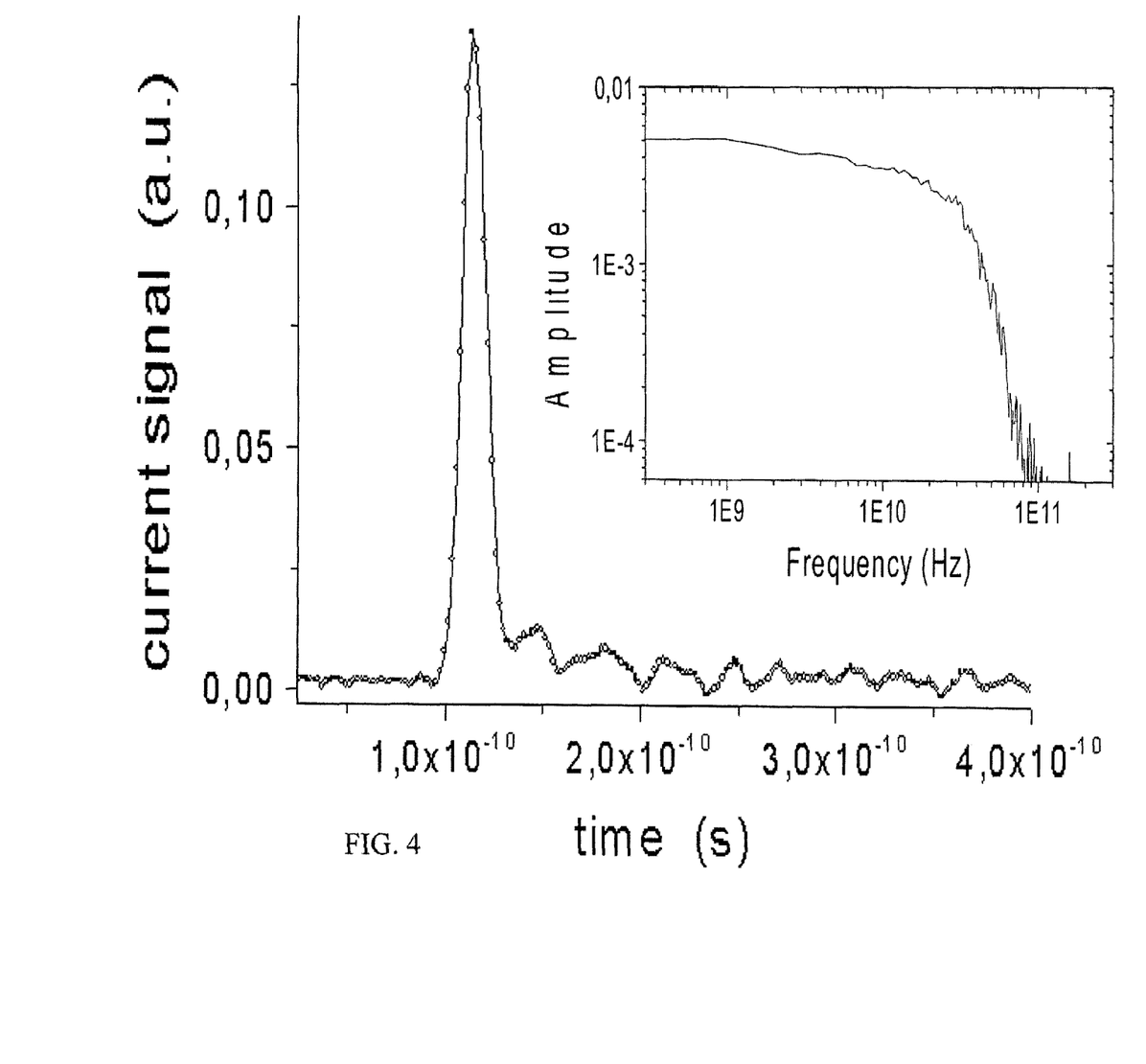
FIG. 4 is a graph showing the response of a barrier enhanced 2DEG based photodetector to excitation by a femtosecond laser pulse.

A photodetector device based on the instant invention uses the same structure and a 2DEG cloud as in detector 38 shown in FIG. 1c. The optical response of detector 38 to a femtosecond laser pulse is shown in FIG. 4. The device was in a standard interdigital configuration with a finger width of W=1 $\mu$m and a distance of G=4 $\mu$m measured at 20 V bias. From FIG. 4, FWHM (Full Width at Half Maximum) of the time response is 8.1 ps, its rise time is 8.8 ps, and the fall time is 9 ps. Fast Fourier Transform of the data is shown in the inset of FIG. 4 and has a cut-off frequency of about 34 GHz. The fact that rise time, fall time and FWHM of the peak are comparable, suggests that the limits of the resolution of the measurement system were reached. The data shown is also raw data. This means that detector 38 could be faster than indicated by experimental tests. This performance is not typically expected from a 4 $\mu$m device where average transit time of optically generated carriers with saturated velocity of $10^7$ cm/sec is more than 20 picoseconds. This unexpected behavior can be explained based on the collection of charge in the 2DEG plasma.

The pulse of light produces electron-hole pairs that in the system of FIG. 3b move vertically due to the internal electric field caused by modulation doping. The electrons are towards the top, and the 2DEG, and the holes move towards the bottom. The travel distance is of sub-micron length and is determined by absorption region depth, which in our design is the resonance cavity length of about 0.12 micrometers (Bragg layers are at the bottom of the absorption layer, not shown in FIG. 1c). The electrons that reach the 2DEG, shown in FIG. 3b, reach a reservoir of mobile carriers in quasi-equilibrium. This 2DEG cloud collectively responds in order to screen the effect of perturbation with relaxation time constants of the order of dielectric relaxation time, or electron-electron cloud scattering time, both of which are in the sub-picosecond range for the electron and can reach as low as 10 femtoseconds. In short, the carriers that reach the electron cloud are collected almost instantaneously; these time constants are electron-plasmon scattering times, energy relaxation times, but not transit times. Detector 38 has effectively broken the transit distance barrier. It will be shown later how the same effect can be used in high speed collection of holes.

The results discussed above with respect to detector 38 demonstrate the existence of the plasma, its quasi-equilibrium state and its collective response to external optical excitation.

A detector that detects THz radiation can operate on the same principles. The basis of the formation of a reservoir of free carriers by modulation doping of a heterojunction is detailed above. The charge cloud is confined to a two-dimensional space and may be further confined to a 1-dimensional environment. Formation of such a cloud of confined charge has been used in high speed transistors and is the basis of the HEMT technology that dominates compound semiconductor technology, such as GaAs, InP, or GaN based semiconductors. In such devices the conductive channel is made of the 2DEG and the main advantage is the reduction of ionized impurity scattering resulting in high drift current. Such a cloud can be used in an entirely different manner by contacting it through blocking Schottky contacts. The picture then is of a reservoir of charge that remains in quasi-equilibrium, since, again, there is little current that flows even at high bias.

FIG. 3b shows the dense cloud of charge produced in an AlGaAs/GaAs modulation doped heterojunction. FIGS. 2a and 2b show that the current flow is in picoampere range, while the same system having ohmic contacts draws milliamps of current. Such a cloud of charge has natural oscillations in charge density. The origin of these oscillations are due to fluctuations in charge density that are accompanied by electric fields which oppose these fluctuations thereby producing oscillations at plasma frequency. The equation for this is shown below:

$$\omega_p = (q^2 n/K_s \in_0 m^*)^{1/2}$$

which can be sustained if $\omega_p \tau > 1$ where $\tau$ is the scattering time. This condition ensures that collisions in the cloud do not damp out oscillations, because $\tau$ is of the order of 1 picosecond. The equation above implies that oscillations can be sustained if the carrier density exceeds $10^{17}$ cm$^{-3}$. Similar arguments apply in 2D, showing that the ability to produce a dense free sheet of charge of the order of $10^{12}$ cm$^{-2}$ is sufficient to produce and maintain quantized plasma oscillations, i.e. plasmons. These frequencies are dependent on charge density; hence they are tunable by controlling the carrier density and may range from 400 GHz to over a terahertz. Coupling external radiation to these tunable plasmons is the mechanism used in detecting terahertz radiation.

Figure 5A:
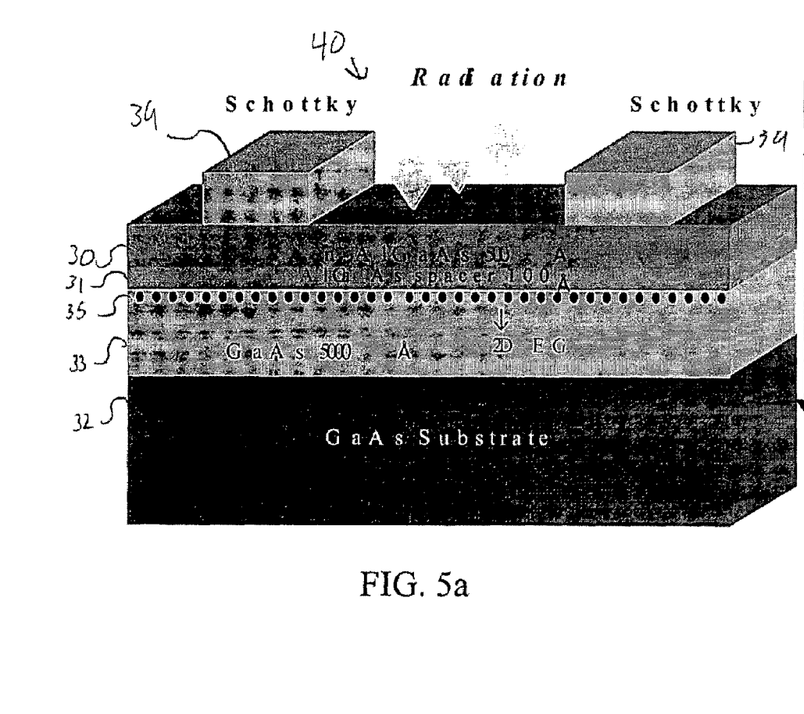
FIG. 5a shows a diagram of a second embodiment of a device for detecting THz radiation or charged particles based on 2DEG plasma.

FIG. 5a shows a second embodiment of a detector. There are two important advantages of detector 40, shown in FIG. 5a, of the instant invention over other plasma based THz sensors; even a damped oscillation in plasma waves propagated through the device is sufficient to cause current change in external circuit, that is, the stringent need for plasmonic resonance is relieved, and Schottky contacts 34 at both ends of the reservoir set the proper boundary condition for reflection of plasma waves, and hence the production of standing waves representing natural oscillation frequencies of the plasma is more easily achieved. Shown in FIG. 5a is the undoped GaAs substrate layer 32. Above the GaAs substrate layer 32 is the GaAs layer 33, which has a thickness of about 5000 Å. Below the AlGaAs material 30 is the AlGaAs spacer layer 31, which has a thickness of about 100 Å. Formed between GaAs layer 33 and AlGaAs spacer layer 31 is the 2DEG 35. In detector 40 the plasmons are excited in a 2DEG 35 directly by coupling to the THz radiation. The 2DEG 35 is not used for the transportation of plasmons, rather, the 2DEG 35 is a reservoir of carriers that forms the plasmons to which radiation may be coupled. Furthermore, the detection device works even at room temperature. The ability to function at room temperature overcomes one of the main problems associated with other THz detectors, namely is the need for cryogenic operation.

Figure 5B:
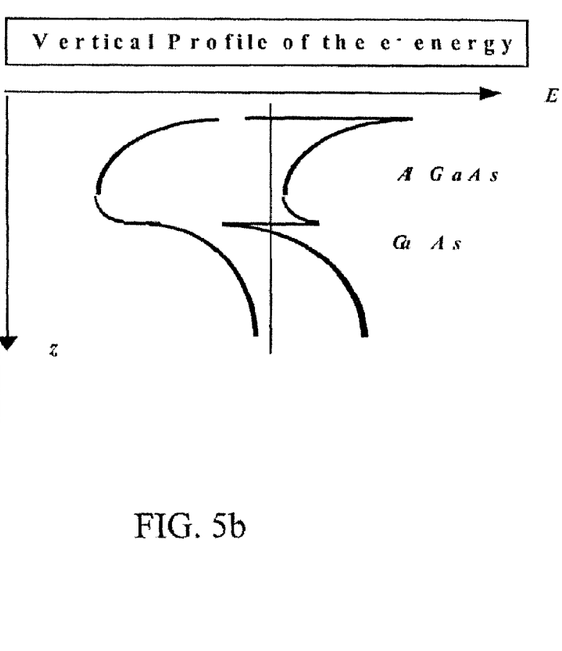
Figure 6A:
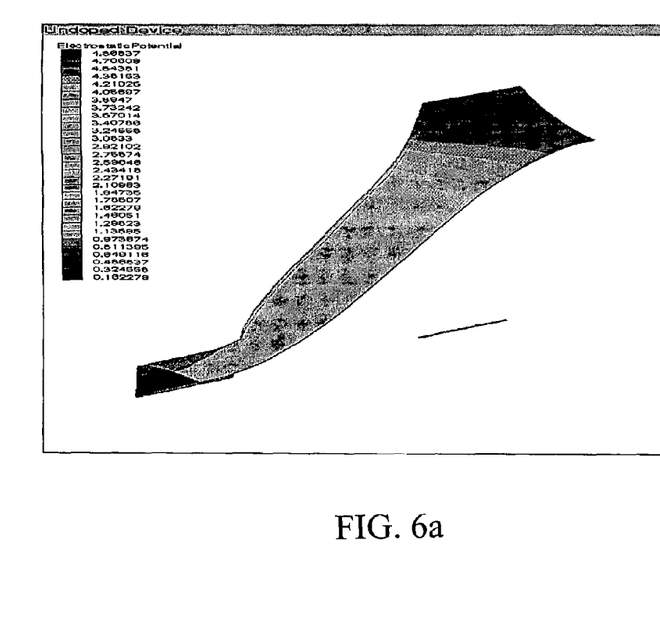
FIG. 6a shows the energy band diagram for the device shown in FIG. 5a when the device is undoped.
Figure 6B:
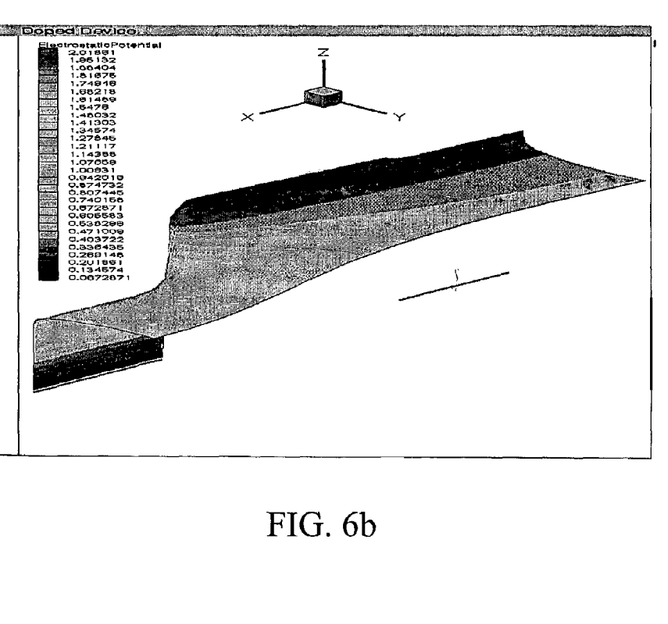
FIG. 6b shows the energy band diagram for the device shown in FIG. 5a when the device is doped.

The detector 40 then has the schematic shown in FIG. 5a. GaAs/AlGaAs material is used because it is a mature technology and similar structures for HEMT devices can be obtained. Additionally, the density of the 2DEG 35 is high when using GaAs/AlGaAs material. Also, Schottky contacts 34 can be made that maintain the plasma in its quasi-equilibrium state. FIG. 5b shows the vertical energy profile of the electron energy. As mentioned above, other technologies, such as InP/InGaAs, GaN/AlGaN, and Si/SiGe can also be used for this purpose. FIGS. 6a and 6b show the calculated energy band diagram under 5V of bias for two cases: one in which AlGaAs is not doped, hence no 2DEG exists, and second when it is doped. The energy band diagram indicates the existence of the plasma by showing how it shields the electric field only to the cathode.

There is the ability to produce spatial variation in carrier density. This can be accomplished by putting Schottky gates 34 on top of the 2DEG reservoir. Even if spatial variation of carrier density is produced using Schottky gates 34, detector 40 will operate by coupling to these plasmons while they transport a signal. The spatial charge density profile depends also on the distance between the contacts, in the same manner that a Fabry-Perot cavity length determines the optical modes. This allows for tuning of the detection frequencies.

Since plasmon frequencies depend on charge density, any mechanism of changing this density results in changing of the detected frequency. That is, this structure is a tunable detector of radiation. Variation of the doping of the widegap is one method of changing the 2DEG charge. Gating of the 2DEG with other electrodes makes a dynamically tunable device. That is application of voltage to this gate, modifies charge density and hence changes the frequency of detection. This means that THz spectroscopy can be performed with these devices. From another perspective, this is a sensing platform. Any stimulus that can modify the charge density results in change of detected frequency. In a typical arrangement the area between cathode and anode is treated to be receptive to particular molecular species. Arrival of the species is then detected since it will change the resonance frequency. Of course, a great advantage of this technology is its monolithic integrability with well-established microfabrication techniques, hence a dense array of optoelectronic circuits can be fabricated on the same substrate.

As mentioned previously, another application of the device based on 2DEG/2DHG is the detection of charged particles, such as electrons. The same concept captured in the device structure of FIG. 5a is used for detection of an electron beam. Such a beam of negatively charged particles exerts a coulombic force on the confined 2D cloud of charge causing detectable current flow. This mechanism is completely different from the typical process of generation of electron-hole pairs in the semiconductor produced by incident electrons. A 2DHG device works in the same manner except that the coulombic force is repulsive rather than attractive.

Figure 7A:
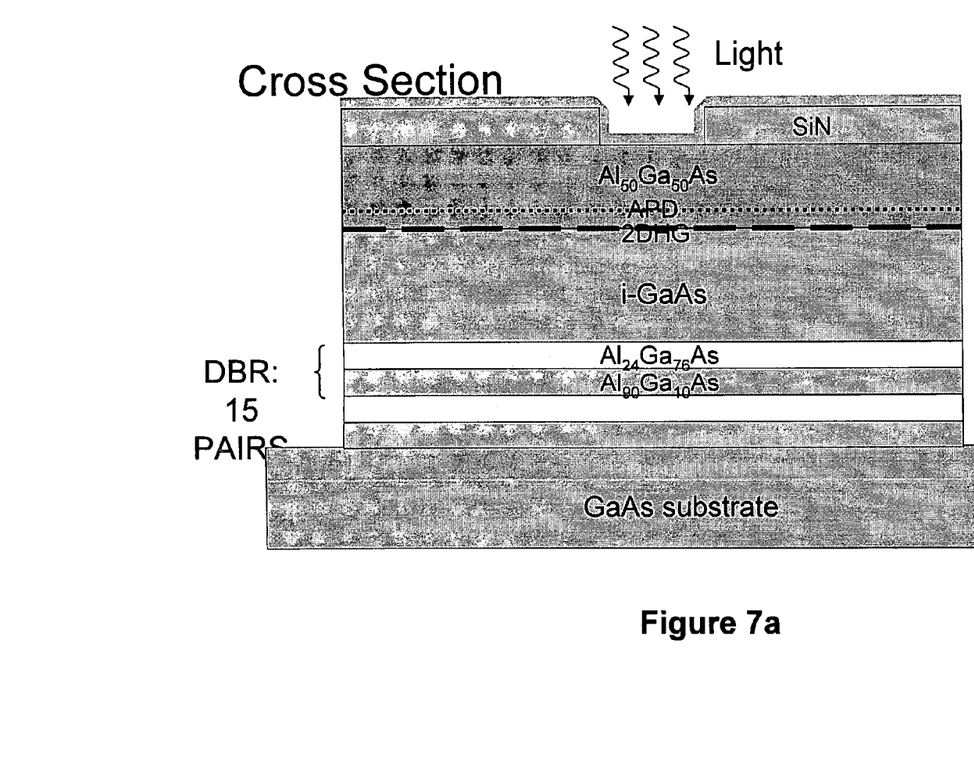
FIG. 7a shows a diagram of the embodiment of a 2DHG device for detecting THz radiation, also used for fast collection of optically generated holes and for charged particle detection.
Figure 7B:
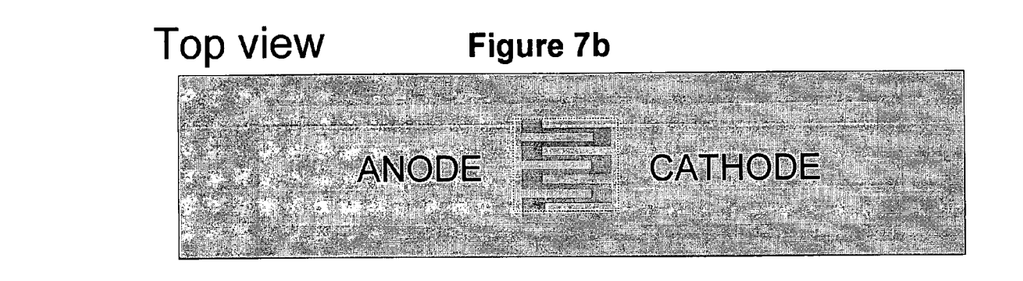
Figure 7C:
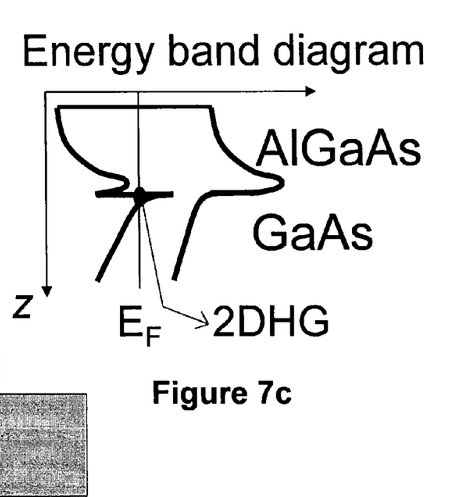
FIG. 7c shows a sketch of an energy band diagram indicating confinement of holes.

The device structure for a 2DHG device has been implemented in GaAs/AlGaAs material system is shown in FIG. 7a. A 2DHG is formed in GaAs by p-type doping of the widegap AlGaAs. A top view of the device is shown in FIG. 7b and is seen to be identical to the 2DEG device. A sketch of the energy band diagram showing hole confinement is shown in 7c. It has been observed that a current flows in this device when the electron beam of a scanning electron microscope is incident on it, in order to verify that it acts as an electron detector.

Figure 8A:
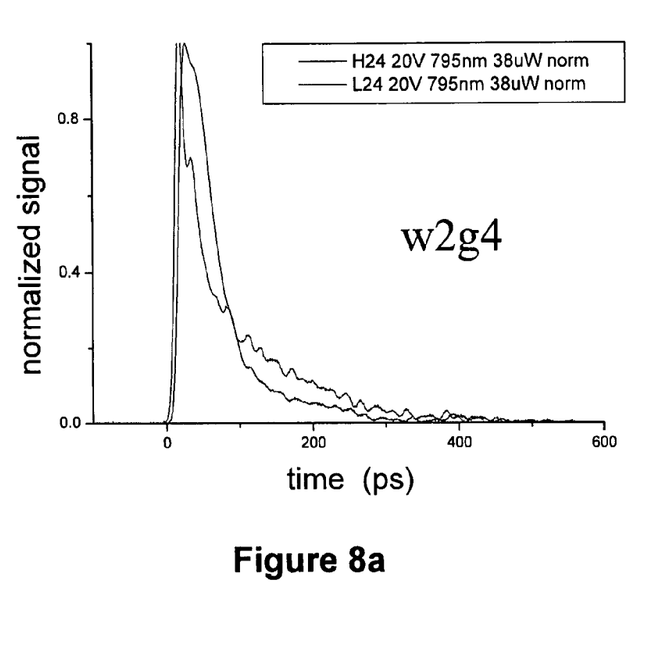
FIG. 8a shows a plot of the time response of the 2DHG device to a femtosecond laser pulse with a distance between cathode and anode of 4 micrometers.
Figure 8B:
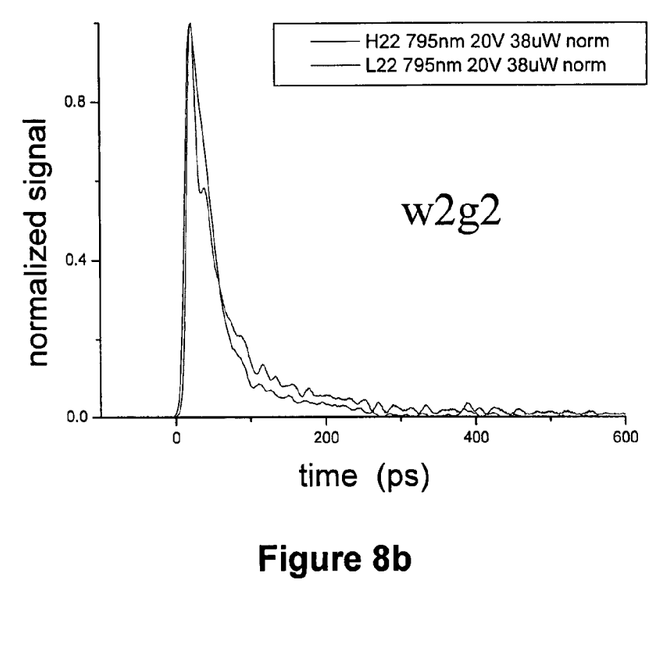
FIG. 8b shows a plot of the time response of the 2DHG device to a femtosecond laser pulse with a distance between cathode and anode of 2 micrometers.

An important utility of the 2D cloud of free charge carriers is collection of optically generated carriers. As it has been noted before, when optically generated carriers reach this reservoir of charge carriers, they no longer travel with drift velocity but are subject to much faster processes such as dielectric relaxation. FIGS. 8a and b show the time response of the device to a femtosecond laser source. Comparing this time response to that of the 2DEG device shown in FIG. 4, shows that the present device is substantially slower. This is expected since the response due to the slow moving holes is being observed. In FIGS. 8a and b two identical devices are compared two that differ only in that one marked high doping (HD) is doped heavily while the other is lightly doped (LD). The HD device is observed to have a slower rise time but a faster fall time. FIGS. 8a and 8b compare these devices when the distance between cathode and anode is changed from 2 to 4 µm. This tail of response, which is due to slow moving holes, is essentially independent of the transit distance between cathode and anode. This proves that the holes that reach the 2DHG are essentially collected.

Figure 9A:
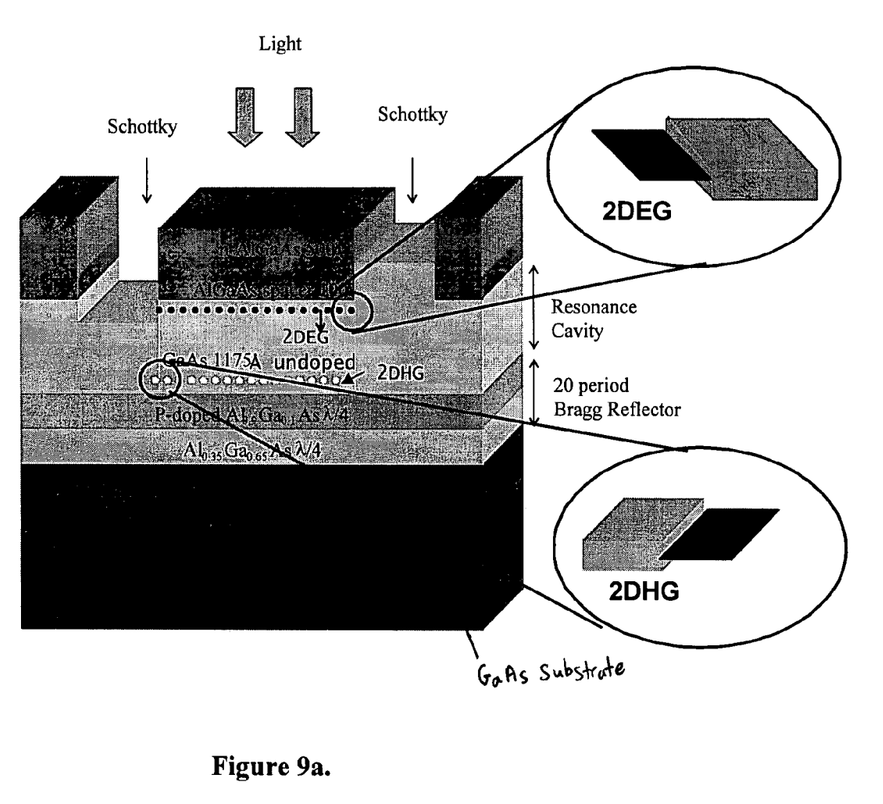
FIG. 9a shows a diagram of an embodiment of a device containing both 2DHG and 2DEG for fast collection of optically generated carriers.
Figure 9B:
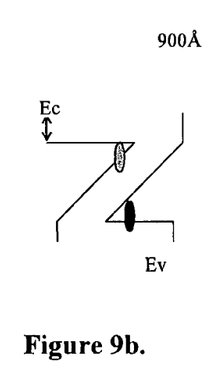
FIG. 9b shows a sketch of an energy band indicating confinement of both electrons and holes.

Having established the utility of the 2DEG and the 2DHG in collection of, respectively, electrons and holes, a photodetector device structure is shown in FIG. 9, which combines both clouds. Two heterojunctions are formed and doped such that 2DEG and 2DHG are both present in the absorption region. The thickness of this region is typically chosen as a resonant cavity for the wavelength of interest. An electric field is established in the GaAs absorption region due to doping of the widegaps that separates the electrons and holes. They travel in opposite direction the short distance of the absorption region and once they reach their respective reservoir of carriers, they can be considered collected. This process will eliminate the limitation of slow velocity of hole motion.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A detector for detecting electromagnetic radiation or charged particles comprising:
   a substrate;
   a two-dimensional reservoir of charge formed on said substrate;
   an AlGaAs layer formed on said two-dimensional reservoir of charge;
   Schottky contacts formed directly on said first AlGaAs layer,
   a coupling apparatus for coupling electromagnetic radiation or charged particles with said two-dimensional reservoir of charge; and
   a detection device for detecting a perturbation in said two-dimensional reservoir of charge by measuring a resonant frequency of one or more plasmons, or measuring the change in current across the Schottky contacts;
   wherein said detection device detects electromagnetic radiation, said two-dimensional plasma comprises charge carriers, and a resonant frequency response of electromagnetic radiation produced in said charge carriers at a resonant frequency forms said one or more plasmons.

2. The detector of claim 1, wherein said electromagnetic radiation is terahertz radiation.

3. The detector of claim 1, further comprising tuning means for adjusting said resonant frequency.

4. The detector of claim 3, wherein said tuning means adjusts said resonant frequency by controlling charge carrier density.

5. The detector of claim 4, wherein said charge carrier density is adjusted by gating using another Schottky contact.

6. The detector of claim 1, further comprising a second layer made of a material selected from the group consisting of GaAs, InP, GaN, and Si.

7. The detector of claim 1, wherein said Schottky contacts are made of a material selected from the group consisting of Ti—Au and SiN.

8. The detector of claim 1, wherein said two-dimensional reservoir of charge comprises a two-dimensional electron gas.

9. The detector of claim 1, wherein said two-dimensional reservoir of charge comprises a two-dimensional hole gas.

10. A method for detecting electromagnetic radiation comprising the steps of:
    forming a two-dimensional reservoir of charge by providing;
    a substrate;
    a two-dimensional reservoir of charge formed on said substrate;
    an AlGaAs layer formed on said two-dimensional reservoir of charge;
    Schottky contacts formed directly on said AlGaAs layer,
    a coupling apparatus for coupling electromagnetic radiation or charged particles with said two-dimensional reservoir of charge; and
    a detection device for detecting a perturbation in said two-dimensional reservoir of charge by measuring a resonant frequency of one or more plasmons, or measuring the change in current across the Schottky contacts; and
    perturbing said two-dimensional reservoir of charge with electromagnetic radiation; and
    detecting a resonant frequency of plasmons of said two-dimensional reservoir of charge by measuring a resonant frequency of said plasmons, or measuring change in current across Schottky contacts.

11. The method of claim 10, further comprising the step of establishing an electrical contact via blocking of Schottky contacts.

12. The method of claim 10, wherein said electromagnetic radiation is terahertz radiation.

13. The method of claim 12, further comprising the step of tuning said resonant frequency by adjusting a charge carrier concentration in said two-dimensional reservoir of charge.

14. A photodetector device comprising:
    a substrate;
    a two-dimensional electron gas and a two-dimensional hole gas formed on said substrate;
    an AlGaAs layer formed on at least one of said two-dimensional electron gas and said two-dimensional hole gas;
    a plurality of Schottky contacts located directly on said AlGaAs layer; and
    a detection device for detecting a perturbation in said two-dimensional reservoir of charge by measuring a resonant frequency of plasmons, or measuring change in current across the plurality of Schottky contacts; wherein said two-dimensional hole gas collects optically generated holes and said two dimensional electron gas collects optically generated electrons, thereby substantially reducing the tail of a response of said photodetector device.

15. The photodetector device of claim 14, wherein said two-dimensional reservoir of charge comprises charge carriers, wherein a resonant frequency response caused by electromagnetic radiation is produced in said charge carriers thereby forming one or more plasmons.

16. The photodetector device of claim 15, further comprising a tuner for tuning said resonance frequency.

17. The photodetector device of claim 16, wherein the tuner for tuning said resonance frequency comprises structure for adjusting a charge carrier concentration in said two-dimensional reservoir of charge.

* * * * *